US006945789B2

(12) United States Patent
Kuwaharada et al.

(10) Patent No.: US 6,945,789 B2
(45) Date of Patent: Sep. 20, 2005

(54) DISPLAY MODULE

(75) Inventors: Takashi Kuwaharada, Hioki-gun (JP); Makoto Wada, Kagoshima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/148,731

(22) PCT Filed: Oct. 2, 2001

(86) PCT No.: PCT/JP01/08688

§ 371 (c)(1),
(2), (4) Date: Jun. 4, 2002

(87) PCT Pub. No.: WO02/29770

PCT Pub. Date: Apr. 11, 2002

(65) Prior Publication Data

US 2003/0002003 A1 Jan. 2, 2003

(30) Foreign Application Priority Data

Oct. 4, 2000 (JP) ........................ 2000-304573

(51) Int. Cl.[7] .............................................. H01R 12/00
(52) U.S. Cl. .......................... 439/67; 439/91; 349/150; 349/151
(58) Field of Search ................... 439/66–71, 91; 349/149–152, 158, 58

(56) References Cited

U.S. PATENT DOCUMENTS 4,655,551 A * 4/1987 Washizuka et al. ........... 439/67
4,772,100 A * 9/1988 Suenaga ..................... 350/336
4,896,946 A * 1/1990 Suzuki et al. ............... 349/150
4,961,126 A * 10/1990 Suzuki ....................... 439/164
5,737,053 A * 4/1998 Yomogihara et al. ......... 439/67
5,822,030 A * 10/1998 Uchiyama ................... 349/149
6,296,493 B1 * 10/2001 Michiya ...................... 439/66
6,342,932 B1 * 1/2002 Terao et al. .................. 439/67
6,358,065 B1 * 3/2002 Terao et al. .................. 439/67

FOREIGN PATENT DOCUMENTS

| EP | 1 039 331 | 9/2000 |
| JP | 11-52882 | 2/1999 |
| JP | 11-258619 | 9/1999 |
| JP | 11-305250 | 11/1999 |
| JP | 11-329717 | 11/1999 |

* cited by examiner

Primary Examiner—Briggitte R. Hammond
(74) Attorney, Agent, or Firm—Hamre, Schumann, Mueller & Larson, P.C.

(57) ABSTRACT

A display module is composed of: a display panel (1) including a display layer and a terminal pattern (1c) connected with an electrode for driving the display layer and formed on the edge portions of the display panel; and a flexible board (2) including a main portion (2a) having an electrode terminal for establishing electrical connection with the terminal pattern and having a geometry approximately the same as the display panel, and a connector portion (2b) connected to the electrode terminal and used for establishing connection with an external circuit. The flexible board is integrated with the display panel by overlapping the main portion with the display panel, and the electrode terminal is arranged so as to face the terminal pattern and connected with the terminal pattern.

4 Claims, 4 Drawing Sheets

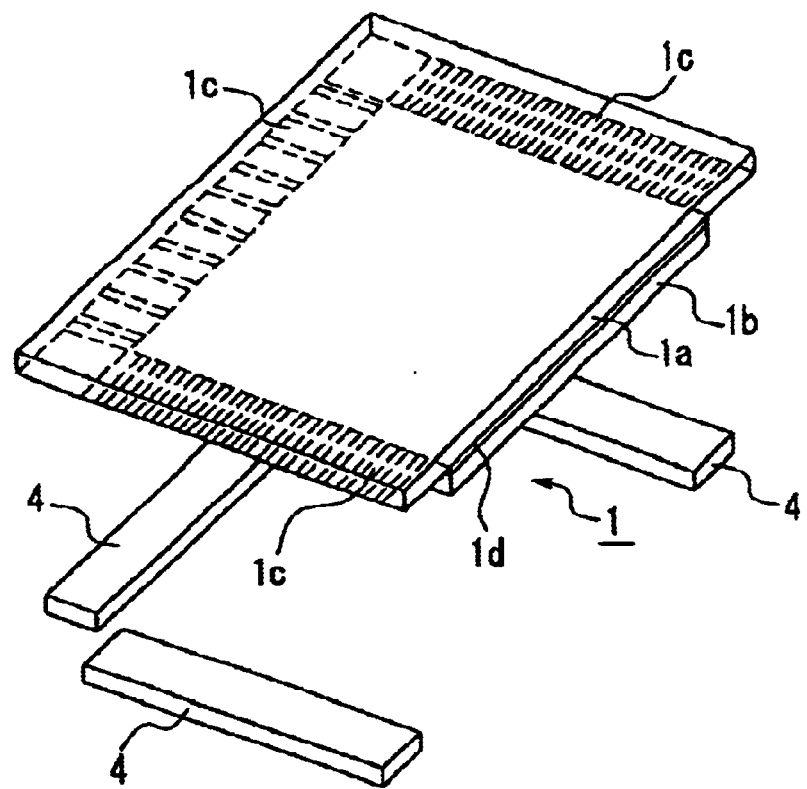
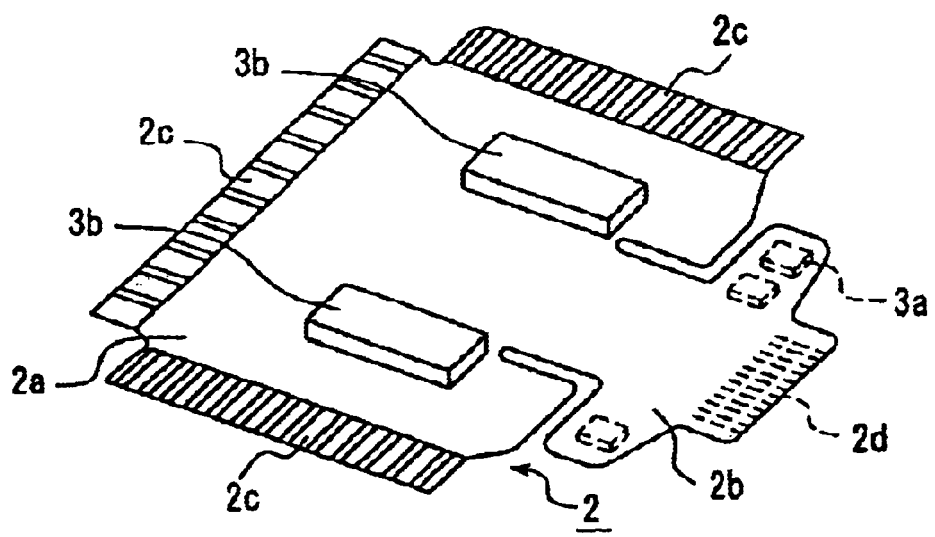
F I G. 1

DISPLAY MODULE

TECHNICAL FIELD

The present invention relates to multicolored or monochrome display modules used for an image display unit of portable electrical equipment such as a mobile phone.

BACKGROUND ART

Display modules that display an image using liquid crystals, organic Electro Luminescence (hereafter, abbreviated as "EL") modules that emit light in response to electrical stimulation, and the like are used in the image display unit of electrical equipment such as a mobile phone. These display modules include modules having glass substrates and film modules having substrates made of resin film. FIG. 5 is a schematic perspective view of a conventional color display module using liquid crystals.

The display module is composed of a display panel 51, three flexible boards 52, 53, and 55, and a main flexible board 54 with which the flexible boards 52, 53, and 55 are connected. The display panel 51 includes a lamination of two glass or resin plates and liquid crystals sealed therebetween. Three flexible boards 52, 53, and 55 are each electrically connected with transparent electrodes that are made of an Indium Tin Oxide (ITO) film or the like and are formed on the surface of the edge portions of three sides of the display panel 51. The display panel 51 includes common and segment electrodes formed thereon. The transparent electrodes connected with those electrodes are electrically connected with a wiring pattern formed on the flexible boards 52, 53 and 55 using electrically conductive tape or paste. In addition to the wiring pattern, the flexible boards 52, 53, and 55 are provided with driver ICs 52a and 53a for driving the liquid crystals sealed in the display panel 51.

The flexible boards 52, 53, and 55 are each soldered to a wiring pattern on the main flexible board 54 with solder joints 52b, 53b, and 55b. Alternatively, these flexible boards are electrically connected with the wiring pattern on the main flexible board 54 by means of connectors or the like. On one end portion of the main flexible board 54, a connector portion 54a is formed. Further, circuit components 54b are mounted on the main flexible board 54. Here, the circuit components 54b include a circuit for exchanging signals with the flexible boards 52, 53, and 55 and a resistor and a capacitor used for exchanging signals with the circuit board included in the main body of the mobile phone.

In the color display module having the above-stated construction, pictures and characters can be displayed on the display panel 51 by electrically connecting the connector portion 54a with the circuit board included in the main body of the mobile phone and inputting signals therein.

Although not illustrated, in the case of organic EL modules as well, connector portions are provided on the edge portions of three sides of the panel, similar to the display panel 51.

However, since such a conventional display module is constructed by assembling four flexible boards (i.e., 52 through 55), the overall size of the device becomes large. Additionally, when incorporating the module into the mobile phone, these flexible boards 52 through 55 have to be bent. This bending process is extremely complicated, and so has a considerable influence on the productivity for the device. Also, due to a volume limitation against miniaturization as a whole, there is a problem that the mobile phone cannot be miniaturized satisfactorily.

Furthermore, since four flexible boards 52 through 55 are used, the materials cost becomes expensive. Additionally, since the flexible boards 52, 53, and 55 each have to be connected with the main flexible board 54 by means of solder joints 52b, 53b, and 55b, the numbers of assembling processes and components are large, which increases the manufacturing cost.

DISCLOSURE OF THE INVENTION

In view of the above-stated problems, the object of the present invention is to provide a multicolored or monochrome display module whose manufacturing cost is not high and is capable of miniaturization.

The display module according to the present invention is composed of: a display panel including a display layer and a terminal pattern connected with an electrode for driving the display layer and formed on edge portions of the display panel; and a flexible board including a main portion having an electrode terminal for establishing electrical connection with the terminal pattern and having a geometry approximately the same as that of the display panel, and a connector portion connected to the electrode terminal and used for establishing connection with an external circuit. The flexible board is integrated with the display panel by overlapping the main portion with the display panel, and the electrode terminal is arranged so as to face the terminal pattern and connected with the terminal pattern.

With this construction, the flexible board can be made smaller, while the device can be realized using only one flexible board. As a result, the overall size of the flexible board can be made smaller, which is effective for miniaturizing the main body of a mobile phone. In addition, there is no need for a bending process of the flexible board and a connecting process such as soldering to the board included in the main body.

In the above display module, the display panel and the flexible board may be integrated with each other by connecting the electrode terminal and the terminal pattern with an electrically conductive adhesive.

In addition, in the above display module, the display panel preferably includes two laminated plates between which the display layer is sealed, and the terminal pattern is formed on a surface of one of the two plates, the plate not coming into contact with the flexible board and the surface facing the flexible board. With this construction, the flexible board can be connected to the display panel securely without bending the connector portion of the flexible board, but simply by aligning the electrode terminal with the terminal pattern.

Furthermore, in the above display module, the display layer may be made of liquid crystals sealed within the gap between the two plates included in the display panel.

Alternatively, in the aforementioned display module, the display layer may be made of organic substances that emit light in response to electrical stimulation.

BRIEF DESCRIPTION OF DRAWINGS

FIG. 1 is a schematic exploded view in perspective of a color display module according to one embodiment of the present invention;

BEST MODE FOR CARRYING OUT THE INVENTION

Figure 2:
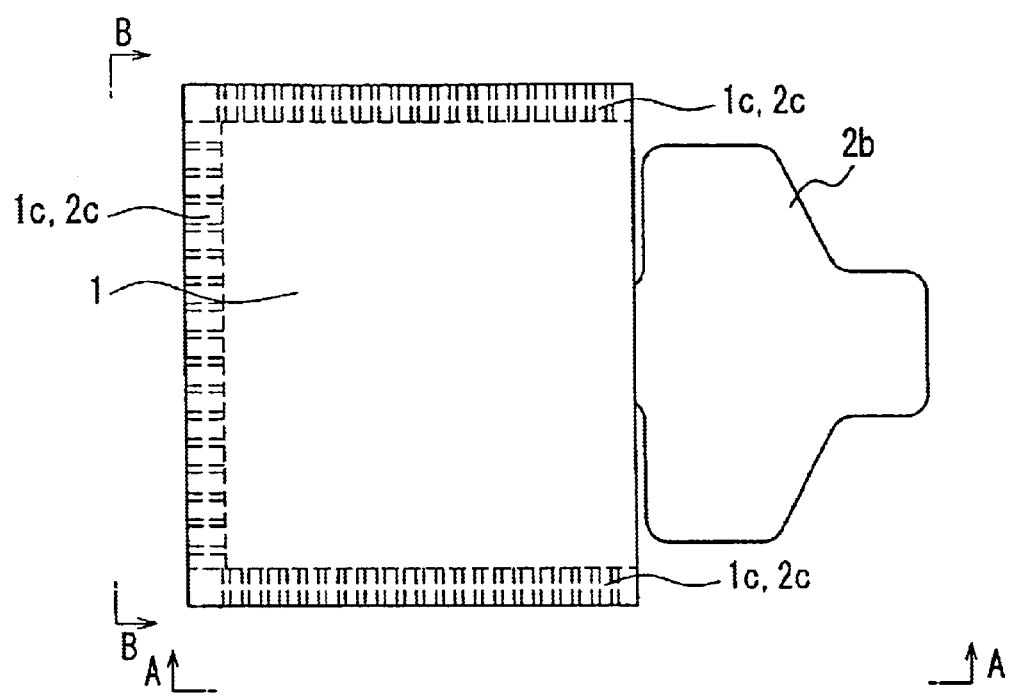
FIG. 2 is a top plan view of the display module according to the present invention.

FIG. 1 is a schematic exploded view in perspective of a color display module according to one embodiment of the present invention. This display module includes a display panel 1 and one flexible board 2 as main components.

The display panel 1 is composed of plates 1a and 1b made of glass or resin that are laminated with each other and liquid crystal (not illustrated), as one example of a display layer 1d, sealed between the plates 1a and 1b. On the undersurface of the plate 1a arranged on the plate 1b, a transparent terminal pattern 1c made of ITO or the like is formed.

The flexible board 2 is in a film form made of synthetic resin and includes a main portion 2a and a connector portion 2b. The main portion 2a has approximately the same geometry as that of the display panel 1. The connector portion 2b is formed so as to project from the center portion of the width of the main portion 2a.

On the top surface of the edge portions of three sides of the main portion 2a other than the side on which the connector portion 2b is arranged, electrode terminals 2c having a pattern matching with the terminal pattern 1c on the display panel 1 are provided. Meanwhile, at the end of the connector portion 2b, a connecting terminal 2d is provided. The connecting terminal 2d is used for establishing connection with an external circuit board, such as a circuit board provided within the main body of a mobile phone. The connecting terminal 2d and the electrode terminals 2c are connected by a wiring pattern (not illustrated). This wiring pattern also is connected to a resistor and a capacitor 3a and driver ICs 3b for driving the liquid crystals.

Figure 3:
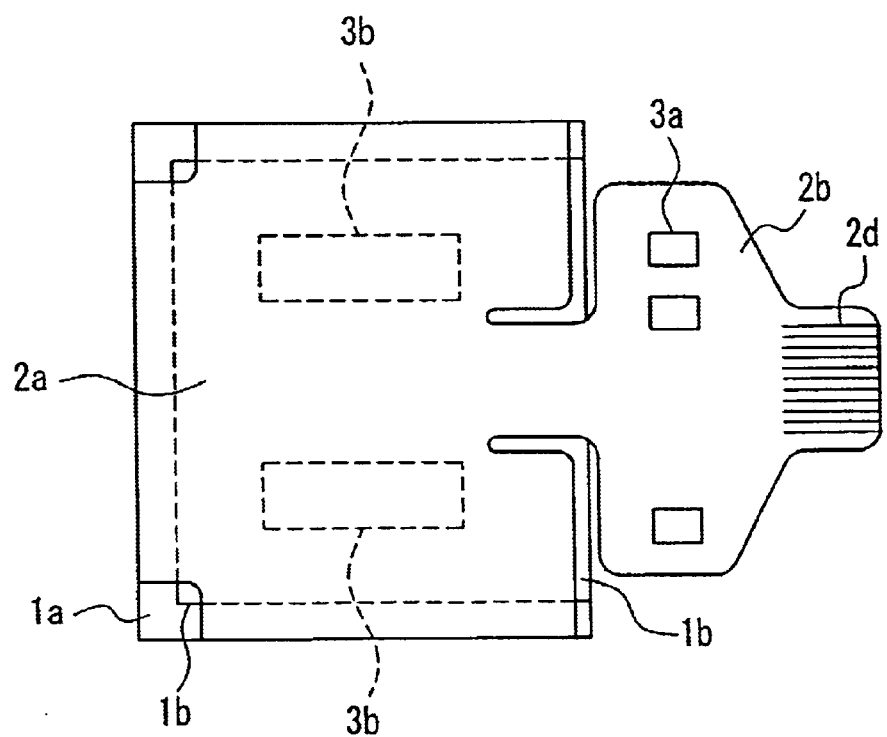
FIG. 3 is a bottom plan view of the display module according to the present invention.

The display panel 1 and the flexible board 2 are assembled into a unit by aligning the terminal patterns 1c formed on the edge portions of the three sides of the display panel 1 with the electrode terminals 2c formed on the flexible board 2 and then electrically connecting the terminal patterns 1c and the electrode terminals 2c using electrically conductive adhesive tape 4. FIG. 2 is a top plan view of thus assembled module. FIG. 3 is a bottom plan view of the same. By assembling in this way, the connecting terminal 2d is connected electrically with the common and segment wiring pattern formed on the display panel 1, and so pictures and characters can be displayed on the display panel 1 by applying signals to the liquid crystals.

As is evident from FIG. 2, the geometry of the main portion 2a is approximately the same as the display panel 1. It is also evident from FIG. 2 that the terminal patterns 1c and the electrode terminals 2c are arranged so as to face each other in the direction perpendicular to the surface of the display module. As stated above, since the main portion 2a of the flexible board 2 has approximately the same geometry as the display panel 1, these elements can be assembled easily into the unit simply by placing the flexible board 2 below the display panel 1.

In this way, the device according to the present invention includes only one flexible board 2 whose size is small. Therefore, as compared with the conventional device where a plurality of flexible boards has to be combined, overall size can be reduced. In addition, materials required for the flexible board 2 can be reduced, and so the materials cost also can be reduced. Furthermore, there is no need for soldering, and so the productivity and the yield can be improved.

Figure 4A:
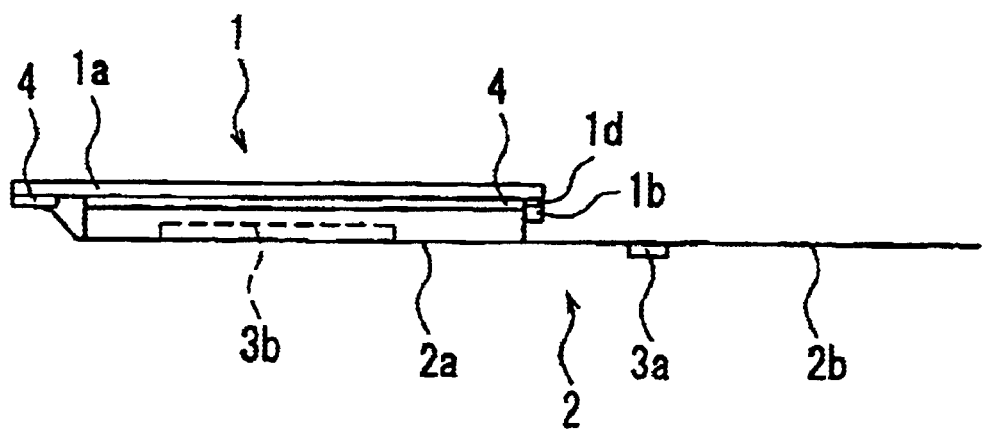
FIG. 4A is a side view from the line A—A of FIG. 2.
Figure 4B:
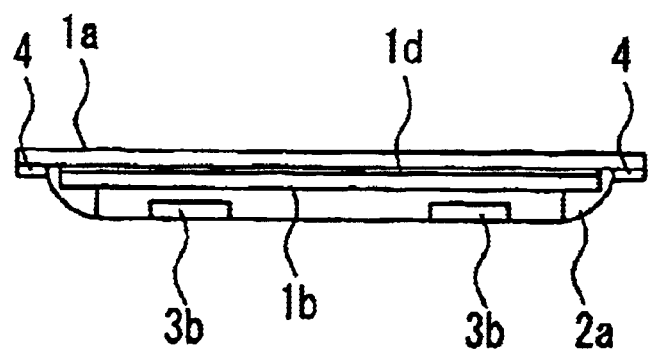
FIG. 4B is a side view from the line B—B of FIG. 2.
Figure 5:
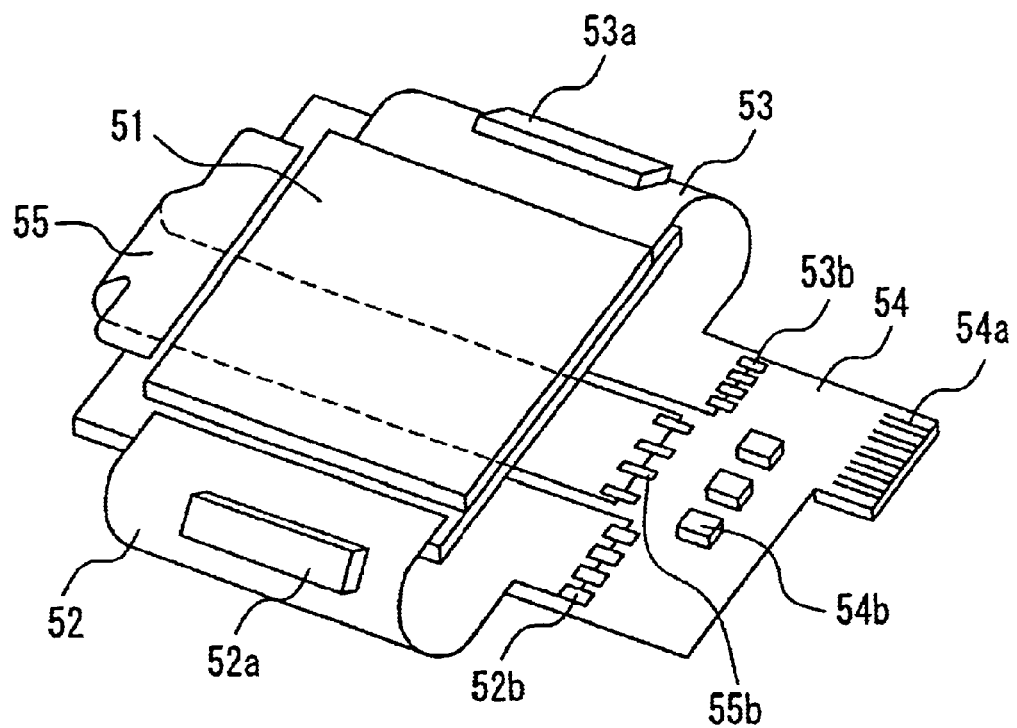
FIG. 5 is a schematic perspective view of a conventional display module.

FIGS. 4A and 4B are side views from the line A—A and the line B—B of FIG. 2, respectively. As shown in these figures, the terminal pattern 1c and the electrode terminal 2c are jointed with each other using the electrically conductive adhesive tape 4. The electrode terminal 2c is connected to the terminal pattern 1c formed on the undersurface of the plate 1a arranged on an upper side, so that there is no need to bend the flexible board 2, resulting in reduction of the overall size, and improvement of the productivity and the yield.

Note here that, instead of the electrically conductive adhesive tape 4, electrically conductive paste may be used for connecting the terminal pattern 1c and the electrode terminal 2c and for fixing them to each other. Also, the display panel 1 and the flexible board 2 may be assembled in another manner other than the joint between the terminal pattern 1c and the electrode terminal 2c. That is, joint for assembly may be formed by another construction, and the terminal pattern 1c and the electrode terminal 2c can be connected with each other simply for their electrical connection.

Further, the present invention also is applicable to the case where an organic EL panel is used as the display panel instead of a liquid crystal panel. Here, the organic EL panel includes as a display layer 1d organic substances that emit light in response to electrical stimulation. The shape and connecting method of the terminal pattern 1c is the same as in the liquid crystal display panel as described above. So long as a module is constructed so that a required image is displayed on the panel by applying a voltage thereto, the present invention is applicable to any other constructions.

Industrial Applicability

According to the present invention, only one flexible board is used and moreover the size of the flexible board may be small. As a result, the overall size of the display module can be reduced. With this construction, the materials cost can be reduced, the simplified manufacturing process enables the productivity and the yield to be improved, and therefore the device cost can be reduced. In addition, since there is no need of a bending process, the display module can be made smaller, and cheaper.

What is claimed is:

1. A display module comprising:

a display panel including a display layer sandwiched between two plates and a terminal pattern connected with an electrode for driving the display layer and formed on edge portions of the display panel; and a flexible board including a main portion that has electrode terminals for establishing electrical connection with the terminal pattern and has a geometry approximately the same as that of the display panel, and a connector portion connected to the electrode terminal and used for establishing connection with an external circuit, wherein the terminal pattern of the display panel is provided on a common surface of one of the plates along three side edges, the common surface facing the display layer, the electrode terminals of the flexible board are provided at edge portions on a common surface of the main portion so as to correspond to the terminal pattern of the display panel, the flexible board is integrated with the display panel by overlapping the main portion with the display panel, with only the common surface of the main portion facing the common surface of the plate so that the electrode terminals face the terminal pattern, and the electrode terminals are connected with the terminal pattern using an electrically conductive tape or an electrically conductive adhesive.

2. The display module according to claim 1, wherein the display layer is made of organic substances that emit light in response to electrical stimulation.

3. The display module according to claim 1, wherein the display panel includes two laminated plates between which the display layer is sealed, and the terminal patten is formed on a surface of one of the two plates, which is not in contact with the flexible board, the surface facing the flexible board.

4. The display module according to claim 3, wherein the display layer is made of liquid crystal sealed within a gap between to two plates included in the display panel.

* * * * *